United States Patent
Veerasamy

(10) Patent No.: US 7,585,396 B2
(45) Date of Patent: *Sep. 8, 2009

(54) COATED ARTICLE WITH ION TREATED OVERCOAT LAYER AND CORRESPONDING METHOD

(75) Inventor: Vijayen S. Veerasamy, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 874 days.

This patent is subject to a terminal disclaimer.

(21) Appl. No.: 10/875,520

(22) Filed: Jun. 25, 2004

(65) Prior Publication Data

US 2006/0008656 A1    Jan. 12, 2006

(51) Int. Cl.
*C23C 14/35* (2006.01)

(52) U.S. Cl. ............... 204/192.27; 204/192.16; 204/192.23; 204/192.26; 427/523; 427/524; 427/530; 427/529

(58) Field of Classification Search ............ 204/192.16, 204/192.23, 192.26, 192.27, 192.28; 427/523, 427/524, 527, 529, 530
See application file for complete search history.

(56) References Cited

U.S. PATENT DOCUMENTS

| | | | |
|---|---|---|---|
| 4,851,095 A | 7/1989 | Scobey et al. | |
| 4,948,482 A | 8/1990 | Kobayashi et al. | |
| 5,015,353 A * | 5/1991 | Hubler et al. | 427/527 |
| 5,425,861 A | 6/1995 | Hartig et al. | |
| 5,443,862 A | 8/1995 | Buffat et al. | |
| 5,514,476 A | 5/1996 | Hartig et al. | |
| 5,569,362 A | 10/1996 | Lerbet et al. | |
| 6,261,693 B1 | 7/2001 | Veerasamy | |
| 6,359,388 B1 | 3/2002 | Petrmichl | |
| 6,395,333 B2 | 5/2002 | Veerasamy | |
| 6,425,987 B1 * | 7/2002 | Lee et al. | 204/192.11 |
| 6,447,891 B1 | 9/2002 | Veerasamy et al. | |
| 6,461,731 B1 | 10/2002 | Veerasamy et al. | |
| 6,495,251 B1 | 12/2002 | Arbab et al. | |
| 6,576,349 B2 | 6/2003 | Lingle et al. | |
| 6,589,658 B1 | 7/2003 | Stachowiak | |
| 6,592,992 B2 | 7/2003 | Veerasamy | |
| 6,592,993 B2 | 7/2003 | Veerasamy | |
| 6,596,399 B2 | 7/2003 | Veerasamy | |
| 6,602,371 B2 | 8/2003 | Veerasamy | |

(Continued)

OTHER PUBLICATIONS

Ray et al. "Effect of reactive-ion bombardment on the properties of silicon nitride and oxynitride films deposited by ion-beam sputtering", J. Appl. Phys., 75(12), Jun. 15, 1994, pp. 8145-8152.*

(Continued)

*Primary Examiner*—Rodney G McDonald
(74) *Attorney, Agent, or Firm*—Nixon & Vanderhye P.C.

(57) ABSTRACT

A coated article is provided that may be used as a vehicle windshield, insulating glass (IG) window unit, or the like. Ion beam treatment is performed on a layer(s) of the coating. For example, an overcoat layer (e.g., of silicon nitride) of a low-E coating may be ion beam treated in a manner so as to cause the ion beam treated layer to include (a) nitrogen-doped $Si_3N_4$, and/or (b) nitrogen graded silicon nitride. It has been found that this permits durability of the coated article to be improved.

19 Claims, 9 Drawing Sheets

U.S. PATENT DOCUMENTS

| | | |
|---|---|---|
| 6,623,846 B2 | 9/2003 | Laird |
| 6,627,317 B2 | 9/2003 | Wang |
| 6,660,340 B1 | 12/2003 | Kirkpatrick |
| 6,663,753 B2 | 12/2003 | Veerasamy et al. |
| 6,665,033 B2 | 12/2003 | Callegari et al. |
| 6,667,121 B2 | 12/2003 | Wang |
| 6,689,476 B2 | 2/2004 | Veerasamy et al. |
| 6,706,363 B2 | 3/2004 | Honda et al. |
| 6,713,178 B2 | 3/2004 | Veerasamy |
| 6,723,211 B2 | 4/2004 | Lingle et al. |
| 2002/0064662 A1 | 5/2002 | Lingle et al. |
| 2003/0150711 A1 | 8/2003 | Laird |
| 2003/0194567 A1 | 10/2003 | Lingle et al. |
| 2003/0194570 A1 | 10/2003 | Lingle et al. |
| 2003/0235719 A1* | 12/2003 | Grimal et al. ............... 428/698 |
| 2004/0067362 A1 | 4/2004 | Veerasamy et al. |
| 2004/0067363 A1 | 4/2004 | Bienkiewicz et al. |
| 2004/0115343 A1 | 6/2004 | Carcia et al. |

OTHER PUBLICATIONS

"EPR-Study of Nitrogen Implanted Silicon Nitride", XP-002351405 Shames et al., Solid State Communications 118 (2001) pp. 129-134.

* cited by examiner

• High Dynamic Deposition Rate → High Defect Density in Sputtered SiNx

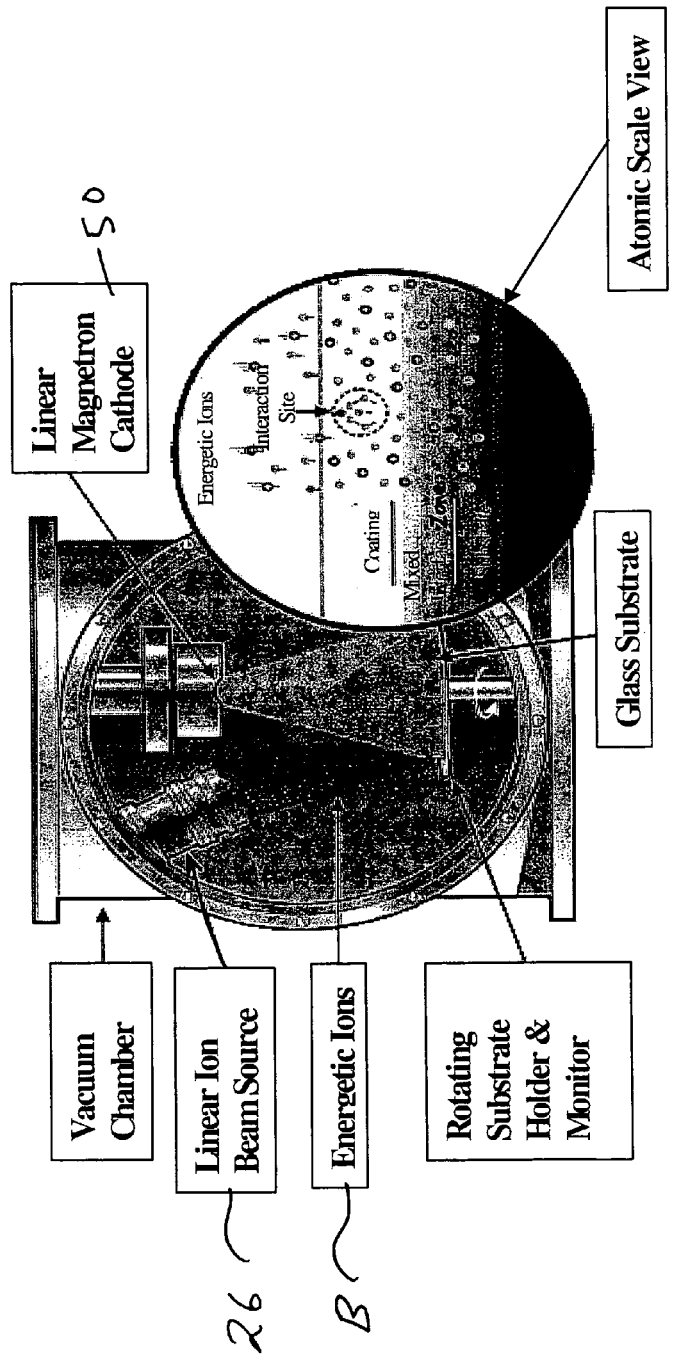

COATED ARTICLE WITH ION TREATED OVERCOAT LAYER AND CORRESPONDING METHOD

This invention relates to a coated article including a solar control coating such as a low-E coating. In certain example embodiments, the low-E coating includes a layer (e.g., an overcoat layer) which is ion treated. In certain example embodiments, the layer(s) may be treated with an ion beam in a manner so as to cause the layer to become graded as to nitrogen content. In certain example embodiments, an overcoat layer comprising silicon nitride is deposited at least via sputtering and is ion beam treated with at least nitrogen (N) ions in a manner so as to become nitrogen graded. Coated articles according to certain example embodiments of this invention may be used in the context of vehicle windshields, insulating glass (IG) window units, other types of windows, or in any other suitable application.

BACKGROUND OF THE INVENTION

Coated articles are known in the art for use in window application such as insulating glass (IG) window units, vehicle windows, and/or the like. Example non-limiting low-emissivity (low-E) coatings are illustrated and/or described in U.S. Pat. Nos. 6,723,211; 6,576,349; 6,447,891; 6,461,731; 3,682,528; 5,514,476; 5,425,861; and 2003/0150711, the disclosures of which are all hereby incorporated herein by reference.

In certain situations, designers of coated articles with low-E coatings often strive for a combination of high visible transmission, substantially neutral color, low emissivity (or emittance), low sheet resistance ($R_s$), and good durability. High visible transmission for example may permit coated articles to be more desirable in applications such as vehicle windshields or the like, whereas low-emissivity (low-E) and low sheet resistance characteristics permit such coated articles to block significant amounts of IR radiation so as to reduce for example undesirable heating of vehicle or building interiors. It is often difficult to obtain high visible transmission and adequate solar control properties, combined with good durability because materials used to improve durability often cause undesirable drops in visible transmission and/or undesirable color shifts of the product upon heat treatment.

It will be appreciated that it is desirable for such coated articles to be as durable as possible with respect to mechanical durability and/or chemical durability. In certain example instances, solar control coatings are provided with an overcoat layer of silicon nitride (e.g., doped with aluminum or the like in many instances). The silicon nitride overcoat, however, is subject to durability problems especially when sputter-deposited at high deposition rates.

FIG. 1 of the instant application, for example, illustrates that sputter-deposited silicon nitride layers realize an increase in voids defined therein as sputter deposition rate increases (the data in FIG. 1 is from silicon nitride deposited only via sputtering in a known manner). A large number of voids in an overcoat layer can be undesirable since such voids tend to cause the layer to be porous in nature and be susceptible to attack by environmental elements such as oxygen, water, humidity, cement, and/or the like. When voids are attacked by one or more of such environmental elements, this can be problematic with respect to coating durability and/or coloration. For example, such attacks can result in significant changes in coated article coloration due to oxidation for example, and/or mechanical/chemical damage to the coated article. As another example, significant numbers of such voids may render the coated article subject to unpredictable changes in optical properties (e.g., n and/or k) of the coated article upon heat treatment (HT) in certain instances.

One approach to improve durability of coated articles with solar control coatings has been to apply a diamond-like carbon (DLC) coating to an exterior surface thereof. For example, see U.S. Pat. Nos. 6,461,731 and 6,447,891, the disclosures of which are hereby incorporated herein by reference. While the coated articles of the '731 and '891 patents realize excellent durability, the use of significant amounts of DLC in a coated article is sometimes subject to criticism since it can adversely affect optical characteristics thereof. It has been found that layers such as silicon nitride when deposited via sputtering often end up having dangling bonds therein due to the low energy used in sputter-deposition processing. It would be desirable if a technique could be provided, that is capable of reducing the number of Si dangling bonds in a silicon nitride inclusive layer at least in areas proximate an outer surface thereof.

U.S. Pat. No. 5,569,362 discloses a technique for ion beam treating a coating using at least oxygen in order to densify the same. However, the '362 patent is unrelated to nitrogen doping of $Si_3N_4$, fails to disclose or suggest nitrogen grading of a layer, and is undesirable in that it's use of significant amounts of oxygen in the ion beam renders treated layers susceptible to chemical durability problems.

In view of the above, it will be apparent to those skilled in the art that there exists a need for a method of making a coated article having at least one of: (a) improved durability without adversely affecting optical characteristics; (b) reduced dangling Si bonds at least proximate an outer surface of a layer comprising silicon nitride; (c) suitable stress characteristics; (d) N-doping of $Si_3N_4$ in at least a portion of a layer in order to improve chemical and/or mechanical durability; and/or (e) less susceptibility to coloration variations upon environmental exposure and/or heat treatment. There also exists a need for corresponding coated articles.

BRIEF SUMMARY OF EXAMPLE EMBODIMENTS OF THE INVENTION

In certain example embodiments of this invention, ion treatment of an overcoat layer(s) is used to control and/or modify stoichiometry of a layer(s) in a coating (i.e., stoichiometry modification and/or control).

In certain example instances, it has surprisingly been found that the ion treatment if performed with a particular ion energy for a particular material may be performed in a manner which causes the resulting layer to realize improved durability characteristics.

In different embodiments of this invention, the ion beam treatment may be performed: (a) after the layer has been sputter-deposited, and/or (b) while the layer is being sputter-deposited. The former case may be referred to as peening, while the latter case may be referred to as ion beam assisted deposition (IBAD) in certain example instances.

In certain example embodiments of this invention, the ion beam treatment is performed in a manner so as to cause part or all of a silicon nitride inclusive layer to become nitrogen-rich (N-rich). In such embodiments, dangling Si bonds are reduced or eliminated, and excess nitrogen is provided in the layer. This may in certain instances be referred to as a solid solution of N-doped silicon nitride. Thus, in certain example instances, the layer may comprise $Si_3N_4$ which is additionally doped with more nitrogen. In certain example embodiments, the $Si_3N_4$ may be doped with at least 0.1% (atomic %) more nitrogen, more preferably from about 0.5 to 20% more nitrogen, even more preferably from about 1 to 10% more nitrogen, and most preferably from about 2 to 10% more nitrogen (or excess nitrogen). Unlike the nitrogen in the $Si_3N_4$ of the layer, the excess nitrogen (or the doping nitrogen referenced above) is not bonded to Si (but may or may not be bonded to other element(s)). This nitrogen doping of $Si_3N_4$ may be present in either the entire layer comprising silicon nitride, or alternatively in only a part of the layer comprising silicon nitride (e.g., proximate an upper surface thereof in peening embodiments).

Surprisingly, it has been found that this excess nitrogen in the layer (i.e., the N-doping of $Si_3N_4$) is advantageous in that it results in less structural defects, and renders the layer less reactive to oxygen thereby improving durability characteristics.

In certain example embodiments of this invention, at least nitrogen (N) ions are used to ion treat an overcoat layer comprising silicon nitride. In certain example embodiments, using an ion beam treatment post-sputtering (i.e., peening), such an ion beam treatment may include utilizing an energy of at least about 550 eV per $N_2^+$ ion, more preferably from about 550 to 1,200 eV per $N_2^+$ ion, even more preferably from about 600 to 1100 eV per $N_2^+$ ion, and most preferably from about 650 to 900 eV per $N_2^+$ ion (an example is 750 eV per $N_2^+$ ion). It has surprisingly been found that such ion energies permit excellent nitrogen grading characteristics to be realized in a typically sputter-deposited layer of suitable thickness, significantly reduce the number of dangling Si bonds at least proximate the surface of the layer comprising silicon nitride, provide improved stress characteristics to the coating/layer, provide excellent doping characteristics, and/or cause part or all of the layer to become nitrogen-rich (N-rich) which is advantageous with respect to durability. Possibly, such post-sputtering ion beam treatment may even cause the stress of the layer to change from tensile to compressive in certain example instances.

In IBAD embodiments where the ion beam treatment is performed simultaneously with sputtering of the layer, it has surprisingly been found that a lower ion energy of at least about 100 eV per $N_2^+$ ion, more preferably of from about 200 to 1,000 eV per $N_2^+$ ion, more preferably from about 200 to 600 eV per $N_2^+$ ion, still more preferably from about 300 to 500 eV per $N_2^+$ ion (example of 400 eV per $N_2^+$ ion) is most suitable at the surface being treated. It has surprisingly been found that such ion energies in IBAD embodiments significantly reduce the number of dangling Si bonds, provide improved stress characteristics to the coating/layer, provide excellent doping characteristics, and/or cause part or all of the layer to become nitrogen-rich (N-rich) which is advantageous with respect to durability.

In certain example embodiments, the use of ion treatments herein may speed up the manufacturing process by permitting faster speeds to be used in sputter depositing certain layer(s) of a coating without suffering from significant durability problems.

In certain example embodiments of this invention, there is provided a method of making a coated article, the method comprising: providing a glass substrate; forming a layer comprising silver on the glass substrate; forming a layer comprising silicon nitride on the substrate over the layer comprising silver, wherein the layer comprising silicon nitride is formed on the substrate by at least sputtering a target comprising silicon; and ion beam treating the layer comprising silicon nitride in a manner so as to cause the layer comprising silicon nitride to be nitrogen graded so that a portion of the layer comprising silicon nitride further from the glass substrate has a higher nitrogen content than does a portion of the layer closer to the glass substrate.

In other example embodiments of this invention, there is provided a method of making a coated article, the method comprising: providing a glass substrate; ion beam treating a layer comprising silicon nitride using at least nitrogen ions so that the ion beam treated layer comprising silicon nitride comprises nitrogen-doped $Si_3N_4$.

In other example embodiments of this invention, there is provided a method of making a coated article which includes a coating supported by a glass substrate, the method comprising: providing the glass substrate; forming an IR reflecting layer on the glass substrate; forming at least an outermost layer of the coating on the substrate over the IR reflecting layer by using at least a sputtering target; ion beam treating the outermost layer of the coating in a manner so as to cause a stress of the outermost layer of the coating to be compressive due to the ion beam treating.

In still further example embodiments of this invention, there is provided a method of making a coated article which includes a coating supported by a glass substrate, the method comprising: providing the coating so as to include at least one infrared (IR) reflecting layer sandwiched between at least first and second dielectric layers; and in providing the coating, ion beam treating at least one layer thereof in a manner so as to cause a tensile stress thereof to be reduced by at least 10% due to the ion beam treating.

In other example embodiments of this invention, there is provided a method of making a coated article, the method comprising: providing a glass substrate; forming an IR reflecting layer on the glass substrate; and providing a layer comprising silicon nitride on the glass substrate, wherein the layer comprising silicon nitride is ion beam treated using an energy of at least about 550 eV per $N_2^+$ ion, more preferably from about 600 to 1,100 eV per $N_2^+$ ion. It has been surprisingly found that the use of such energies are advantageous with respect to overall durability of the coated article.

In certain example embodiments of this invention, there is provided a coated article including a coating supported by a glass substrate, comprising: a layer comprising silicon nitride supported by the glass substrate; wherein a portion of the layer comprising silicon nitride further from the glass substrate has a higher nitrogen content than does a portion of the layer comprising silicon nitride closer to the glass substrate; and wherein the coated article has a visible transmission of at least about 70% and a sheet resistance ($R_s$) of less than or equal to about 6 ohms/square.

In other example embodiments of this invention, there is provided a coated article including a coating supported by a glass substrate, the coating comprising: a layer comprising silicon nitride located over at least a layer comprising silver; wherein the layer comprising silicon nitride comprises nitrogen-doped $Si_3N_4$.

In still further example embodiments of this invention, there is provided a coated article including a layer comprising silicon nitride located over at least a layer comprising silver; and wherein a portion of the layer comprising silicon nitride further from the glass substrate has a higher nitrogen content than does a portion of the layer comprising silicon nitride closer to the glass substrate.

BRIEF DESCRIPTION OF THE DRAWINGS

FIG. 8 is a diagram illustrating ion beam assisted deposition (IBAD) of a layer according to an example embodiment of this invention.

DETAILED DESCRIPTION OF EXAMPLES OF THE INVENTION

Figure 1:
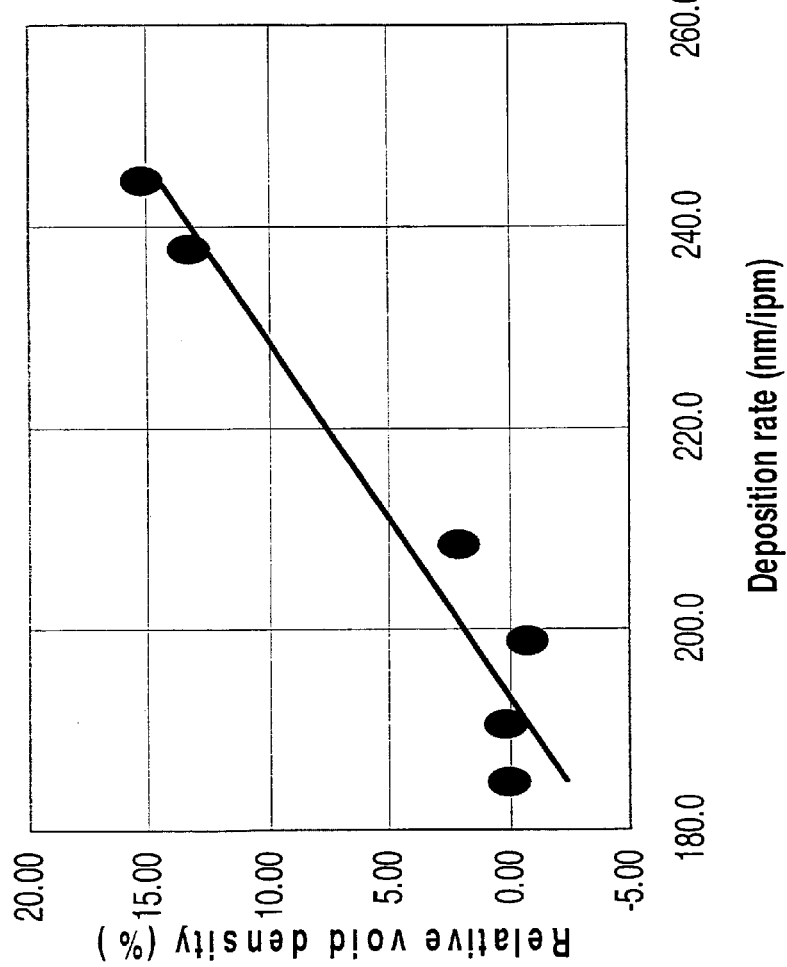
FIG. 1 is a graph illustrating void formation as a function of sputter-deposition rate for silicon nitride.

Referring now to the accompanying drawings in which like reference numerals indicate like parts throughout the several views.

Coated articles herein may be used in applications such as vehicle windshields, monolithic windows, IG window units, and/or any other suitable application that includes single or multiple glass substrates with at least one solar control coating thereon. In vehicle windshield applications, for example, a pair of glass substrates may be laminated together with a polymer based layer of a material such as PVB, and the solar control coating is provided on the interior surface of one of the glass substrates adjacent the polymer based layer. In certain example embodiments of this invention, the solar control coating includes a double-silver stack, although this invention is not so limited in all instances (e.g., single silver stacks and other layer stacks may also be used in accordance with certain embodiments of this invention).

In certain example embodiments of this invention, ion treatment of an overcoat layer(s) is used to control and/or modify stoichiometry of a layer(s) in a coating (i.e., stoichiometry modification and/or control).

In certain example instances, it has surprisingly been found that the ion treatment if performed with a particular ion energy for a particular material may be performed in a manner which causes the resulting layer to realize improved durability characteristics. For instance, chemical and mechanical durability can be significantly improved. It is also possible to improve coloration characteristics of the coated article in certain example instances.

In different embodiments of this invention, the ion beam treatment may be performed: (a) after the layer has been sputter-deposited, and/or (b) while the layer is being sputter-deposited. The former case (a) may be referred to as peening, while the latter case (b) may be referred to as ion beam assisted deposition (IBAD) in certain example instances. Peening embodiments are particularly useful in forming nitrogen graded layers, providing N-doping of $Si_3N_4$, and/or improving stress characteristics of a layer. Meanwhile, IBAD embodiments (e.g., see FIG. 8) are particularly useful for providing N-doping of silicon nitride and/or improving stress characteristics of a layer.

In certain example embodiments of this invention, the ion beam treatment (via peening and/or IBAD) is performed in a manner so as to cause part or all of a silicon nitride inclusive layer to become nitrogen-rich (N-rich). In such embodiments, dangling Si bonds are reduced or eliminated, and excess nitrogen is provided in the layer. This may in certain instances be referred to as a solid solution of N-doped silicon nitride. Thus, in certain example instances, the layer may comprise $Si_3N_4$ which is additionally doped with more nitrogen. In certain example embodiments, the $Si_3N_4$ may be doped with at least 0.1% (atomic %) more nitrogen, more preferably from about 0.5 to 20% more nitrogen, even more preferably from about 1 to 10% more nitrogen, and most preferably from about 2 to 10% more nitrogen (or excess nitrogen). Unlike the nitrogen in the $Si_3N_4$ of the layer, the excess nitrogen (or the doping nitrogen referenced above) is not bonded to Si (but may or may not be bonded to other element(s)). This nitrogen-doped $Si_3N_4$ may be present in either the entire layer comprising silicon nitride, or alternatively in only a part of the layer comprising silicon nitride (e.g., proximate an upper surface thereof in peening embodiments).

Surprisingly, it has been found that this excess nitrogen in the layer (i.e., the nitrogen doping of $Si_3N_4$) is advantageous in that it results in less structural defects, and renders the layer less reactive to oxygen thereby improving durability characteristics.

In silicon nitride layers discussed herein that are of or include nitrogen-doped $Si_3N_4$ (e.g., see layer 25, or any other suitable silicon nitride layer), the excess N (i.e., the doping N) is not bonded to Si since substantially all of the Si is bonded to nitrogen or the like making up at least $Si_3N_4$. This doping N is instead either floating in the silicon nitride inclusive layer so as to provide a solid solution of N-doped $Si_3N_4$, or alternatively may be bonded to other element(s) in the layer such as aluminum in certain example instances.

In certain IBAD embodiments, if the appropriate ion energy is used for a given material, the compressive stress of the IBAD-deposited layer may be from about 50 MPa to 2 GPa, more preferably from about 50 MPa to 1 GPA, and most preferably from about 100 MPa to 800 MPa.

In certain example embodiments of this invention, ion beam treatment is used to control and/or modify stoichiometry of a layer(s) in a coating (i.e., stoichiometry modification and/or control). The ion beam performs nanoscale film modifications using inert and/or reactive gas(es), so that depending on the circumstances it is possible to nano-engineer the kinetics of film surface arrangement or rearrangement to as to obtain phases away from thermodynamic equilibrium. The layer(s) to be ion beam treated may be deposited on a substrate such as a glass substrate, and other layer(s) may or may not be located between the glass substrate and the layer(s) to be modified by ion beam treatment. In certain example embodiments, the ion beam treatment may utilize at least nitrogen ions. During the ion beam treating of the layer, ions used in the treating may or may not penetrate the entire layer; the layer is ion treated even if only an upper portion (e.g., upper half, upper third, etc.) of the layer is so treated.

In certain example instances, it has surprisingly been found that the ion treatment may improve durability and/or coloration characteristics of the coated article by at least one of: (i) creating nitrogen-doped $Si_3N_4$ in at least part of the layer, thereby reducing Si dangling bonds and susceptibility to oxidation; (ii) creating a nitrogen graded layer in which the nitrogen content is greater in an outer portion of the layer closer to the layer's outer surface than in a portion of the layer further from the layer's outer surface; (iii) increasing the density of the layer which has been ion beam treated, (iv) using an ion energy suitable for causing the stress characteristics of the layer to be improved; (v) improving stoichiometry control of the layer, (vi) causing the layer to be less chemically reactive following ion treatment thereof, (vii) causing the layer to be less prone to significant amounts of oxidation following the ion treatment, and/or (vii) reducing the amount and/or size of voids in the layer which is ion treated. In certain example embodiments of this invention, the ion treatment is treatment using an ion beam from at least one ion source.

In certain example embodiments of this invention, at least nitrogen (N) ions are used to ion treat an overcoat layer comprising silicon nitride. In certain example embodiments, using an ion beam treatment post-sputtering (i.e., peening), such an ion beam treatment may include utilizing an energy of at least about 550 eV per $N_2^+$ ion, more preferably from about 550 to 1,200 eV per $N_2^+$ ion, even more preferably from about 600 to 1100 eV per $N_2^+$ ion, and most preferably from about 650 to 900 eV per $N_2^+$ ion (an example is 750 eV per $N_2^+$ ion). It has surprisingly been found that such ion energies permit excellent nitrogen grading characteristics to be realized in a typically sputter-deposited layer of suitable thickness, significantly reduce the number of dangling Si bonds at least proximate the surface of the layer comprising silicon nitride, provide improved stress characteristics to the coating/layer, provide excellent doping characteristics, and/or cause part or all of the layer to become nitrogen-rich (N-rich) which is advantageous with respect to durability. Possibly, such post-sputtering ion beam treatment may even cause the stress of the layer to change from tensile to compressive in certain example instances.

In IBAD embodiments where the ion beam treatment is performed simultaneously with sputtering of the layer, it has surprisingly been found that a lower ion energy of at least about 100 eV per $N_2'$ ion, more preferably of from about 200 to 1,000 eV per $N_2^+$ ion, more preferably from about 200 to 600 eV per $N_2^+$ ion, still more preferably from about 300 to 500 eV per $N_2^+$ ion (example of 400 eV per $N_2^+$ ion) is most suitable at the surface being treated. It has surprisingly been found that such ion energies in IBAD embodiments significantly reduce the number of dangling Si bonds, provide improved stress characteristics to the coating/layer, provide excellent doping characteristics, and/or cause part or all of the layer to become nitrogen-rich (N-rich) which is advantageous with respect to durability.

In certain example peening embodiments of this invention, an anode-cathode voltage may be used in an ion beam source (e.g., see FIGS. 6-8) of from about 800 to 4,000 V, more preferably from about 1,000 to 3,000 V, and most preferably from about 1,000 to 1,700 V (e.g., 1,500 V) for the ion beam treatment. In certain example IBAD embodiments, an anode-cathode voltage in the source (e.g., see FIGS. 6-8) of from about 400 to 3,000 V may be used, more preferably from about 500 to 2,000 V, even more preferably from about 600 to 1,000 V, and for example 800 V.

In certain example embodiments, the use of ion treatments herein may speed up the manufacturing process by permitting faster speeds to be used in sputter depositing certain layer(s) of a coating without significant concern about suffering from significant durability problems. In other words, void formation upon initial sputtering is not particularly problematic, because many or all of such voids may be reduced and/or eliminated by the ion treatment of the sputter-deposited layer.

The ion beam may be a focused ion beam, a collimated ion beam, or a diffused ion beam in different embodiments of this invention.

Coated articles according to different embodiments of this invention may or may not be heat treated (HT) in different instances. The terms "heat treatment" and "heat treating" as used herein mean heating the article to a temperature sufficient to achieve thermal tempering, heat bending, and/or heat strengthening of the glass inclusive article. This definition includes, for example, heating a coated article in an oven or furnace at a temperature of least about 580 degrees C., more preferably at least about 600 degrees C., for a sufficient period to allow tempering, bending, and/or heat strengthening. In certain instances, the HT may be for at least about 4 or 5 minutes. In certain example embodiments of this invention, ion treated silicon nitride overcoat layers are advantageous in that they change less with regard to color and/or transmission during optional heat treatment; this can improve interlayer adhesion and thus durability of the final product.

Figure 2A:
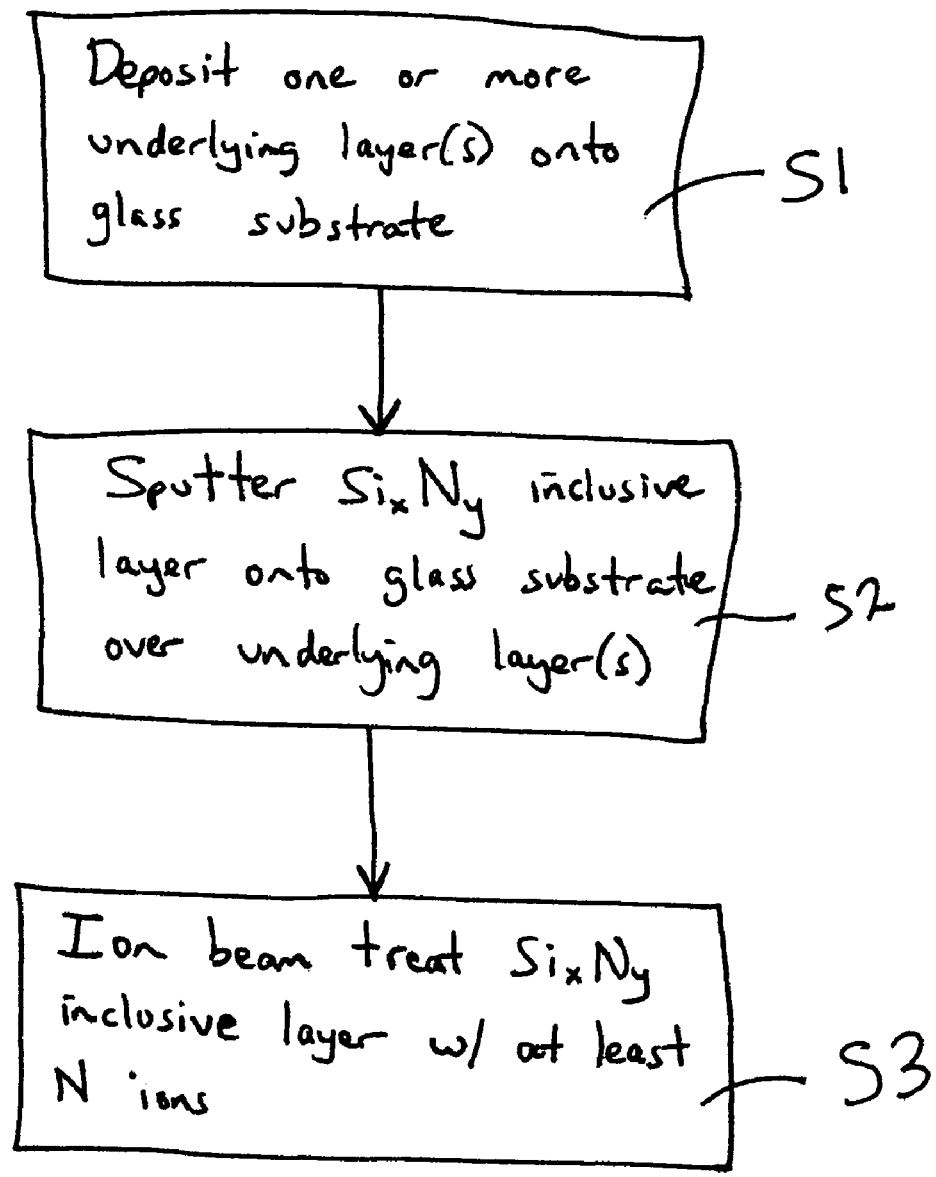
FIGS. 2(a) and 2(b) are flowcharts illustrating certain steps carried out in making a coated article according to example embodiments of this invention.

FIG. 2($a$) is a flowchart illustrating certain steps carried out according to an example embodiment of this invention where post-sputtering ion beam treatment (or peening) is used. Initially, a glass substrate is provided. One or more underlying layers is/are then deposited (e.g., sputter deposited) onto the glass substrate (S1). For example, in embodiments where a plurality of underlayers are provided, a first dielectric layer may be deposited on the substrate and thereafter an infrared (IR) reflecting layer of a material such as Ag, Au or the like may be deposited on the substrate over at least the first dielectric layer, followed by at least a contact layer and/or dielectric layer. Then, an overcoat layer of or including silicon nitride is sputter-deposited on the glass substrate over the underlying layer(s) (S2). This silicon nitride layer may be sputter-deposited using magnetron sputtering or the like using a rotatable target for example. This silicon nitride overcoat may be initially sputter deposited in any suitable stoichiometric form including but not limited to $Si_3N_4$ or a Si-rich type of silicon nitride. Example Si-rich types of silicon nitride are discussed in U.S. 2002/0064662 (incorporated herein by reference), and any Si-rich layer discussed therein may be initially sputter-deposited as the overcoat silicon nitride layer according to different embodiments of this invention. The silicon nitride layer may of course be doped with aluminum (e.g., 1-10%) or the like in certain example embodiments of this invention.

Still referring to FIG. 2($a$), after step S2 has been completed, the silicon nitride layer sputter-deposited in step S2 is then treated with an ion beam including at least nitrogen ions (S3). This ion beam treatment (peening) introduces at least nitrogen ions into the silicon nitride inclusive layer deposited in step S2. In certain example embodiments of this invention, an ion energy of the ion source and of the nitrogen ions is utilized which will cause at least a majority of the nitrogen ions to make their way into and penetrate at least part of the silicon nitride overcoat layer originally sputter-deposited in step S2. The process of FIG. 2($a$) when used with appropriate ion energies causes the silicon nitride layer to becomes nitrogen graded so that more nitrogen is provided in a portion of the layer proximate the outer surface thereof than is provided in a portion of the layer closer to the glass substrate. In certain example embodiments of this invention, an outermost 20 Å thick portion of the layer comprising silicon nitride (e.g., see layer 25) has at least a 5% higher nitrogen content (more preferably at least 10% higher) than an innermost 20 Å thick portion of the layer comprising silicon nitride.

Moreover, the process of FIG. 2($a$) when used with appropriate ion energies also causes nitrogen doped $Si_3N_4$ to form in at least part of the layer. In certain example instances, a portion of the layer proximate the outer surface thereof comprises nitrogen doped $Si_3N_4$ whereas a portion of the layer closer to the glass substrate does not. As explained above, this has been found to significantly improve durability of the coating. In certain example instances, at least 5% of the silicon nitride inclusive layer comprises nitrogen doped $Si_3N_4$, more preferably at least 10% of the layer, even more preferably at least 20% of the layer, and sometimes from 10-100% of the layer.

Figure 2B:
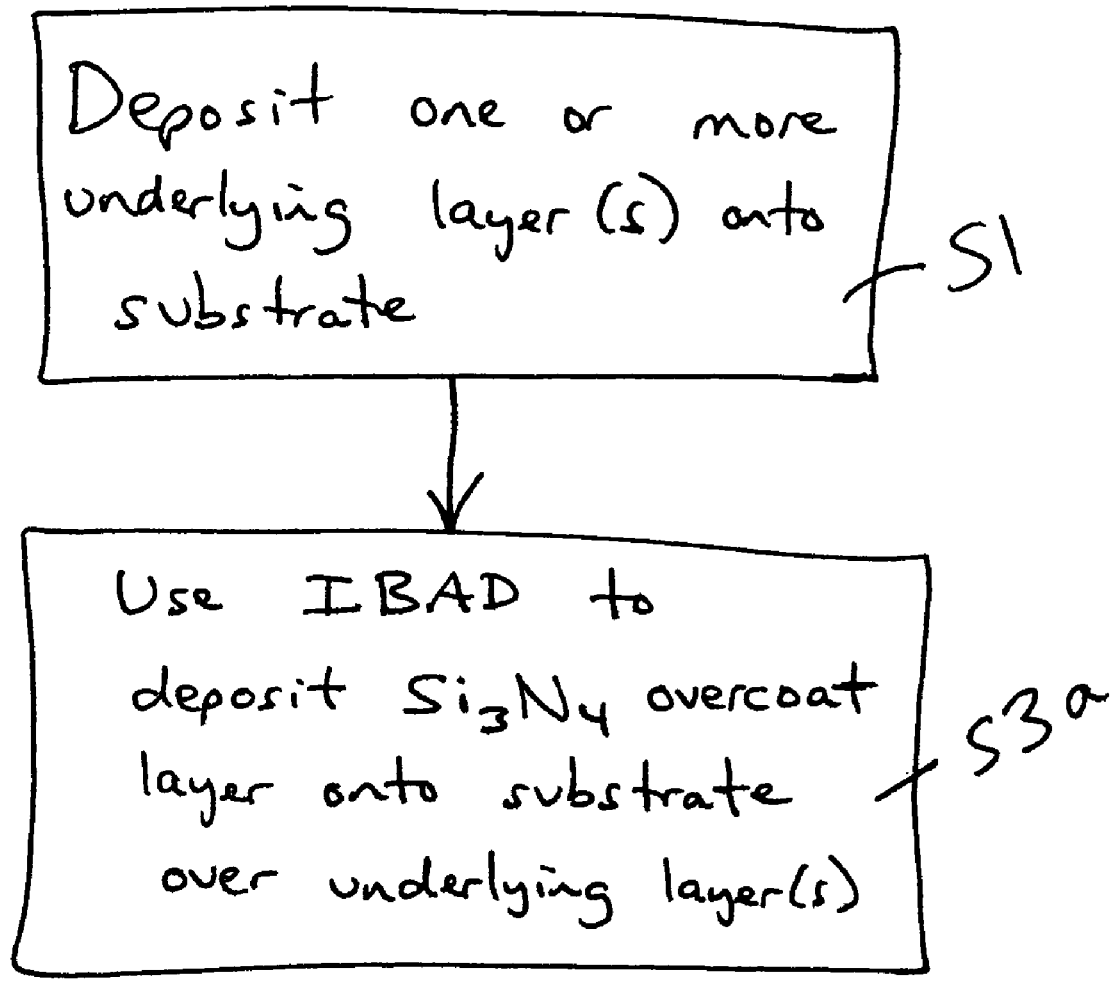

FIG. 2(b) is a flowchart illustrating certain steps carried out according to an example embodiment of this invention where IBAD is used to deposit a silicon nitride inclusive overcoat layer. Initially, a substrate (e.g., glass substrate) is provided. One or more underlying layers is/are then deposited (e.g., sputter deposited) onto the substrate (S1). For example, in embodiments where a plurality of underlayers are provided, a first dielectric layer may be deposited on the substrate and thereafter an infrared (IR) reflecting layer of a material such as Ag, Au or the like may be deposited on the substrate over at least the first dielectric layer, followed by at least a contact layer and/or dielectric layer. Then, an overcoat layer of or including silicon nitride is deposited via IBAD on the substrate over the underlying layer(s) (S3a). As shown in FIG. 8 for example, IBAD simultaneously uses both sputtering and ion beam treatment in depositing the layer. In certain IBAD embodiments, and as shown in FIG. 8, the ion beam and the sputtering particles impinge upon the substrate and/or layer in a common area so as to intersect. In such a manner, the high energy from the ion beam is continuously provided during at least part of the sputtering to continuously densify and improve bonding of the layer being IBAD deposited. As explained above, the process of FIG. 2(b) when used with appropriate ion energies and a Si inclusive sputtering target, causes a layer comprising nitrogen doped $Si_3N_4$ to form. In certain example instances, much or all of the silicon nitride inclusive layer is of or includes nitrogen doped $Si_3N_4$. As explained above, this has been found to significantly improve durability of the coating.

Sputtering used for sputter-depositing silicon nitride in a conventional manner (e.g., via magnetron sputtering) is a relatively low energy process. As a result, sputter-deposited silicon nitride layers are not particularly dense. Moreover, because of the relatively low energy involved in sputter-depositing silicon nitride, sputter-deposited silicon nitride layers typically suffer from weak Si—N bonds since at least certain amounts of nitrogen end up trapped in the layer in a manner not well-bonded to silicon, as well as many dangling Si bonds with no N bonded thereto. Unfortunately, this results in a rather porous layer which is prone to oxidation which can cause optical properties (n and/or k) of the layer and thus the coating to significantly change. For example, environmental elements such as water, humidity, oxygen, cement, and/or the like tend to cause the optical properties of sputter-deposited silicon nitride to vary in an unpredictable manner thereby resulting in possible color and/or transmission changes. In certain example embodiments of this invention, the aforesaid problems with conventional sputter-deposited silicon nitride layers are addressed and remedied by ion treating the silicon nitride layer via peening and/or IBAD. In IBAD embodiments for example, silicon nitride growth from ions has been found to be better than growth from neutrals such as in sputtering. In particular, the increased kinetic energy obtained in ion treating the silicon nitride layer helps the layer to grow and/or form in a more dense manner and/or with improved stoichiometry (e.g., with better Si—N bonding). The higher density, stronger bonds, and added Si—N bonds resulting from the ion treatment are advantageous with regard to durability and the like.

In certain example embodiments, it has also been found that ion beam treatment of a silicon nitride overcoat layer herein using appropriate ion energies in a suitable manner can cause the layer's stress to be switched from tensile to compressive, or IBAD deposited as compressive, due to the ion treatment. This can be desirable with respect to durability. Moreover, it is also believed that this can also cause the stress of other layer(s) underlying the silicon nitride overcoat layer to change into a more desirable form which can further improve durability in certain example embodiments of this invention. If the stress of layers under the layer being treated changes from tensile to compressive, this can improve interlayer adhesion and/or other durability related characteristics of the coated article.

It has also been found that ion beam treating of a layer comprising silicon nitride increases the hardness of such a layer according to certain example embodiments of this invention (e.g., via IBAD or peening). A layer comprising silicon nitride when conventionally sputtered typically has a hardness of from 10-14 GPa. In certain example embodiments of this invention however, when ion beam treated, the silicon nitride layer realizes a hardness of at least 20 GPa, more preferably of at least 22 GPa, and most preferably of at least 24 GPa.

Figure 3:
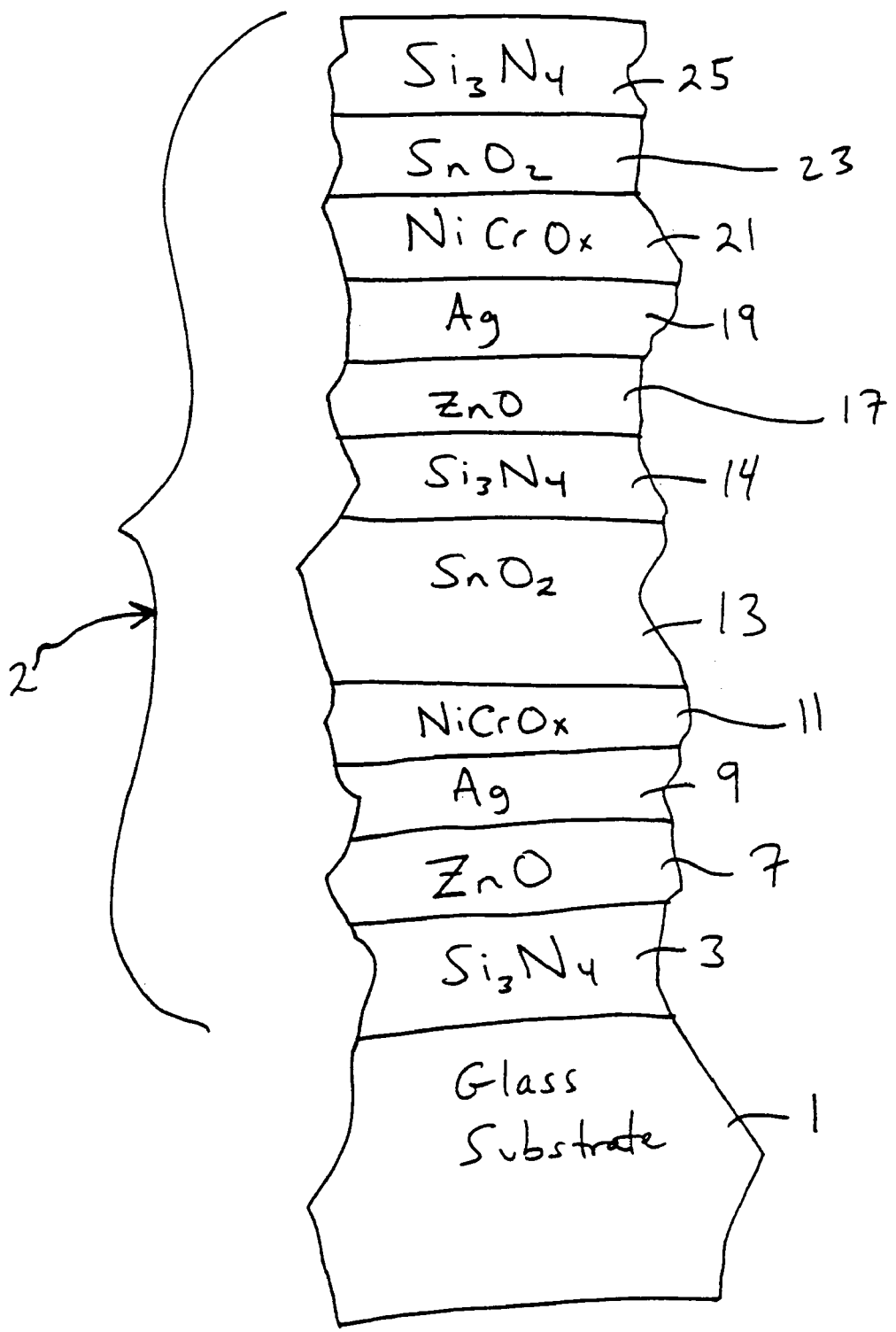
FIG. 3 is a cross sectional view of a coated article according to an example embodiment of this invention.

FIG. 3 is a side cross sectional view of a coated article according to an example non-limiting embodiment of this invention. The coated article includes substrate 1 (e.g., clear, green, bronze, or blue-green glass substrate from about 1.0 to 10.0 mm thick, more preferably from about 1.0 mm to 3.5 mm thick), and a low-E coating (or layer system) 2 provided on the substrate 1 either directly or indirectly. The coating (or layer system) 2 includes, in this example embodiment: dielectric silicon nitride layer 3 which may be of $Si_3N_4$, of the Si-rich type for haze reduction, or of any other suitable stoichiometry of silicon nitride in different embodiments of this invention, first lower contact layer 7 (which contacts IR reflecting layer 9), first conductive and preferably metallic or substantially metallic infrared (IR) reflecting layer 9, first upper contact layer 11 (which contacts layer 9), dielectric layer 13 (which may be deposited in one or multiple steps in different embodiments of this invention), another silicon nitride layer 14, second lower contact layer 17 (which contacts IR reflecting layer 19), second conductive and preferably metallic IR reflecting layer 19, second upper contact layer 21 (which contacts layer 19), dielectric layer 23, and finally dielectric silicon nitride overcoat layer 25. The "contact" layers 7, 11, 17 and 21 each contact at least one IR reflecting layer (e.g., layer based on Ag). The aforesaid layers 3-25 make up low-E (i.e., low emissivity) coating 2 which is provided on glass or plastic substrate 1. Silicon nitride layer 25 is the outermost layer of the coating 2.

In monolithic instances, the coated article includes only one glass substrate 1 as illustrated in FIG. 3. However, monolithic coated articles herein may be used in devices such as laminated vehicle windshields, IG window units, and the like. A laminated vehicle window such as a windshield includes first and second glass substrates laminated to one another via a polymer based interlayer (e.g., see U.S. Pat. No. 6,686,050, the disclosure of which is incorporated herein by reference). One of these substrates of the laminate may support coating 2 on an interior surface thereof in certain example embodiments. As for IG window units, an IG window unit may include two spaced apart substrates 1. An example IG window unit is illustrated and described, for example, in U.S. Pat. No. 6,632,491, the disclosure of which is hereby incorporated herein by reference. An example IG window unit may include, for example, the coated glass substrate 1 shown in FIG. 3 coupled to another glass substrate via spacer(s), sealant(s) or the like with a gap being defined therebetween. This gap between the substrates in IG unit embodiments may in certain instances be filled with a gas such as argon (Ar). An example IG unit may comprise a pair of spaced apart clear glass substrates each about 4 mm thick one of which is coated with a coating herein in certain example instances, where the gap between the substrates may be from about 5 to 30 mm, more preferably from about 10 to 20 mm, and most preferably about 16 mm. In certain example instances, the coating 2 may be provided on the interior surface of either substrate facing the gap.

In certain example embodiments of this invention, one or both of upper contact layer(s) 11 and/or 21 is oxidation graded. Thus, at least one of NiCr inclusive contact layers 11 and/or 21 may be ion beam treated with at least oxygen ions in order to oxidation graded the same in certain example embodiments of this invention.

Example details relating to layers 3, 7, 9, 11, 13, 14, 17, 19, 21, 23 and 25 of the FIG. 3 coating are discussed in U.S. patent application Ser. No. 10/800,012, the disclosure of which is hereby incorporated herein by reference. For example, dielectric layers 3 and 14 may be sputter-deposited and be of or include silicon nitride in certain embodiments of this invention. Silicon nitride layers 3 and 14 may, among other things, improve heat-treatability of the coated articles, e.g., such as thermal tempering or the like. The silicon nitride of layers 3 and/or 14 may be of the stoichiometric type ($Si_3N_4$) type, or alternatively of the Si-rich type in different embodiments of this invention. Any and/or all of the silicon nitride layers discussed herein may be doped with other materials such as stainless steel or aluminum in certain example embodiments of this invention. For example, any and/or all silicon nitride layers discussed herein may optionally include from about 0-15% aluminum, more preferably from about 1 to 10% aluminum, most preferably from 1-4% aluminum, in certain example embodiments of this invention. The silicon nitride may be deposited by sputtering a target of Si or SiAl in certain embodiments of this invention.

Infrared (IR) reflecting layers 9 and 19 are preferably substantially or entirely metallic and/or conductive, and may comprise or consist essentially of silver (Ag), gold, or any other suitable IR reflecting material. IR reflecting layers 9 and 19 help allow the coating to have low-E and/or good solar control characteristics. The IR reflecting layers may, however, be slightly oxidized in certain embodiments of this invention. Dielectric layer 13 may be of or include tin oxide in certain example embodiments of this invention. However, as with other layers herein, other materials may be used in different instances. Lower contact layers 7 and/or 17 in certain embodiments of this invention are of or include zinc oxide (e.g., ZnO). The zinc oxide of layer(s) 7, 17 may contain other materials as well such as Al (e.g., to form $ZnAlO_x$). For example, in certain example embodiments of this invention, one or more of zinc oxide layers 7, 17 may be doped with from about 1 to 10% Al, more preferably from about 1 to 5% Al, and most preferably about 2 to 4% Al. The use of zinc oxide 7, 17 under the silver 9, 19 allows for an excellent quality of silver to be achieved. Upper contact layers 11 and/or 21 may be of or include NiCr, $NiCrO_x$ and/or the like in different example embodiments of this invention.

Dielectric layer 23 may be of or include tin oxide in certain example embodiments of this invention. However, layer 23 is optional and need not be provided in certain example embodiments of this invention. In certain example embodiments of this invention, silicon nitride overcoat layer 25 may be ion beam treated via peening and/or IBAD, and may comprise, consist of, or consist essentially of nitrogen doped $Si_3N_4$ in certain embodiments of this invention.

Other layer(s) below or above the illustrated coating may also be provided. Thus, while the layer system or coating is "on" or "supported by" substrate 1 (directly or indirectly), other layer(s) may be provided therebetween. Thus, for example, the coating of FIG. 3 may be considered "on" and "supported by" the substrate 1 even if other layer(s) are provided between layer 3 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention.

While various thicknesses and materials may be used in layers in different embodiments of this invention, example thicknesses and materials for the respective layers on the glass substrate 1 in the FIG. 3 embodiment are as follows, from the glass substrate 1 outwardly:

Example Materials/Thicknesses; FIG. 3 Embodiment

| Layer<br>Glass (1-10 mm thick) | Preferred<br>Range (Å) | More<br>Preferred (Å) | Example (Å) |
|---|---|---|---|
| $Si_xN_y$ (layer 3) | 40-450 Å | 190-250 Å | 210 |
| $ZnO_x$ (layer 7) | 10-300 Å | 40-150 Å | 100 |
| Ag (layer 9) | 50-250 Å | 80-120 Å | 98 |
| $NiCrO_x$ (layer 11) | 10-100 Å | 30-45 Å | 35 |
| $SnO_2$ (layer 13) | 0-1,000 Å | 350-630 Å | 570 |
| $Si_xN_y$ (layer 14) | 50-450 Å | 90-150 Å | 120 |
| $ZnO_x$ (layer 17) | 10-300 Å | 40-150 Å | 95 |
| Ag (layer 19) | 50-250 Å | 80-220 Å | 96 |
| $NiCrO_x$ (layer 21) | 10-100 Å | 30-45 Å | 35 |
| $SnO_2$ (layer 23) | 0-750 Å | 150-300 Å | 200 |
| N-doped $Si_3N_4$ (layer 25) | 10-750 Å | 100-320 Å | 180 |

Figure 4:
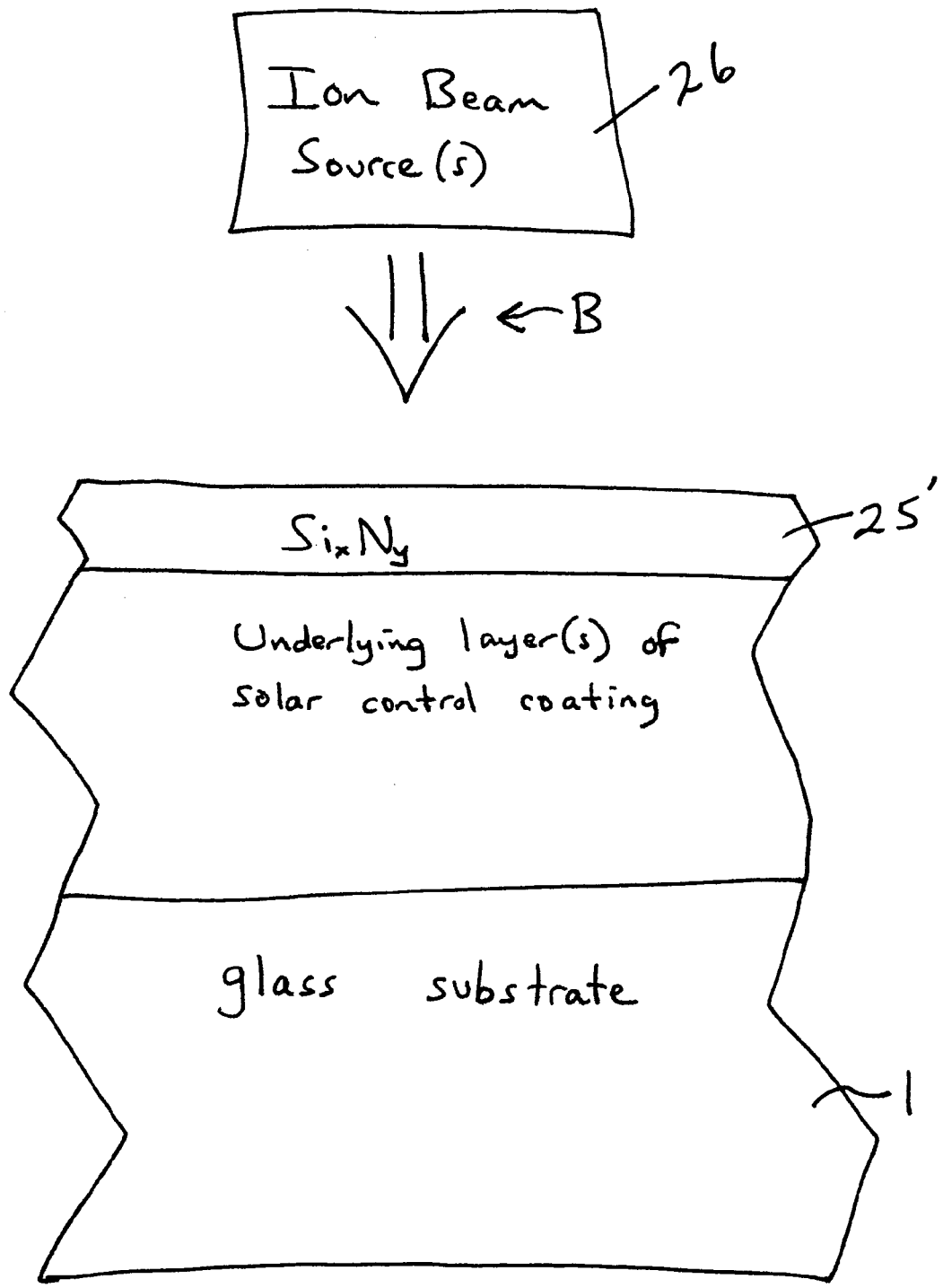
FIG. 4 is a cross sectional view of a coated article according to an example embodiment of this invention, where a silicon nitride overcoat is being ion beam treated with at least nitrogen ions.

Referring to FIGS. 2-4 and 6-8, an example method for making a coated article according to an example embodiment of this invention will now be described. Initially, a glass substrate 1 is provided. Underlying layers 3, 7, 9, 11, 13, 14, 17, 19, 21 and 23 are then sputter deposited on the glass substrate 1 in this order as shown in FIG. 3. Then, overcoat silicon nitride layer 25 is deposited on the substrate 1 over the underlying layers as shown in FIGS. 3-4.

The ion beam treatment of layer 25 may be performed (a) after the silicon nitride layer has been sputter-deposited via peening (e.g., see FIGS. 2(*a*) and 4), and/or (b) via IBAD so that the ion beat treatment is performed while the silicon nitride layer is being sputter-deposited (e.g., see FIGS. 2(*b*), 4 and 8).

In post-sputter deposited peening embodiments, referring to FIG. 4, after silicon nitride overcoat layer 25 has originally been sputter deposited, the originally deposited layer 25 is ion beam treated with an ion beam B as shown in FIG. 4 to form ion treated layer 25'. The ion beam B includes injecting at least nitrogen ions into the silicon nitride layer so as to cause at least one of the following to occur in layer 25' due to the ion beam treatment: (a) formation of nitrogen-doped $Si_3N_4$ in at least part of the layer, thereby reducing Si dangling bonds and susceptibility to oxidation; (b) creating a nitrogen graded layer in which the nitrogen content is greater in an outer portion of the layer closer to the layer's outer surface than in a portion of the layer further from the layer's outer surface; (c) increasing the density of the layer which has been ion beam treated, (d) stress characteristics of the layer to be improved, and/or (e) reducing the amount and/or size of voids in the layer.

In certain post-sputtering peening embodiments, it is desirable to sputter-depositing the silicon nitride layer in Si-rich form so as to be characterized by $SiN_x$, where x is no greater than 1.30 (more preferably no greater than 1.20, even more preferably no greater than 1.10, still more preferably no greater than 1.00). Then, after ion beam treatment with nitrogen ions during peening, the silicon nitride becomes more stoichiometric (i.e., x moves toward 1.33) and even becomes N-doped in certain example embodiments. Stoichiometric silicon nitride is characterized by $Si_3N_4$ (i.e., x is 4/3=1.33).

In IBAD embodiments, FIGS. 2(b) and 8 illustrate that the ion beam treatment is performed simultaneously with sputtering of layer 25. Referring to FIG. 8 in particular, this example embodiment of IBAD uses ion beam assisted sputtering where the deposition device includes both an linear ion beam source(s) 26 and at least one sputtering cathode (e.g., magnetron cathode) 50 in a vacuum chamber or deposition chamber where the ion beam treated layer is deposited by a combination of sputtering and ion beam treatment. The ion beam B (including energetic ions) from the ion source 26 and the particles from the sputtering target(s) impinge upon the substrate or layer being formed in a common area. Preferably, the ion beam B is angled relative to a surface of the substrate at an angle of from about 40 to 70 degrees so as to properly intersect the sputtered particles at the substrate surface. While the substrate support in FIG. 8 is illustrated as being a rotating support, a linear-moving conveying support may be more appropriate in certain example embodiments of this invention. This ion beam treatment causes at least one of the following to occur in the silicon nitride inclusive layer due to the ion beam treatment: (a) formation of nitrogen-doped $Si_3N_4$ in at least part of the layer, thereby reducing Si dangling bonds and susceptibility to oxidation; (b) increasing the density of the layer which has been ion beam treated, (c) stress characteristics of the layer to be improved, and/or (d) reducing the amount and/or size of voids in the layer.

In certain example embodiments of this invention, one or both of NiCr or $NiCrO_x$ layers 11 and/or 21 may be ion beam treated using at least oxygen ions in order to oxidation grade as described in U.S. Ser. No. 10/847,672, filed May 18, 2004, the entire disclosure of which is hereby incorporated herein by reference.

Referring to FIGS. 2, 4 and 6-8, the ion beam B is generated by ion source 26, and introduces at least nitrogen ions into or at the silicon nitride layer. As explained above, an anode-cathode energy at the source is utilized which translates into an ion energy suitable to cause the stress of the silicon nitride layer to end up compressive, or to cause tensile stress to be reduced due to the ion beam treatment.

In certain example embodiments of this invention (whether peening or IBAD is used), the ion beam treatment may be from about 1-30 seconds, more preferably from about 1-20 seconds, to achieve desired results.

Figure 6:
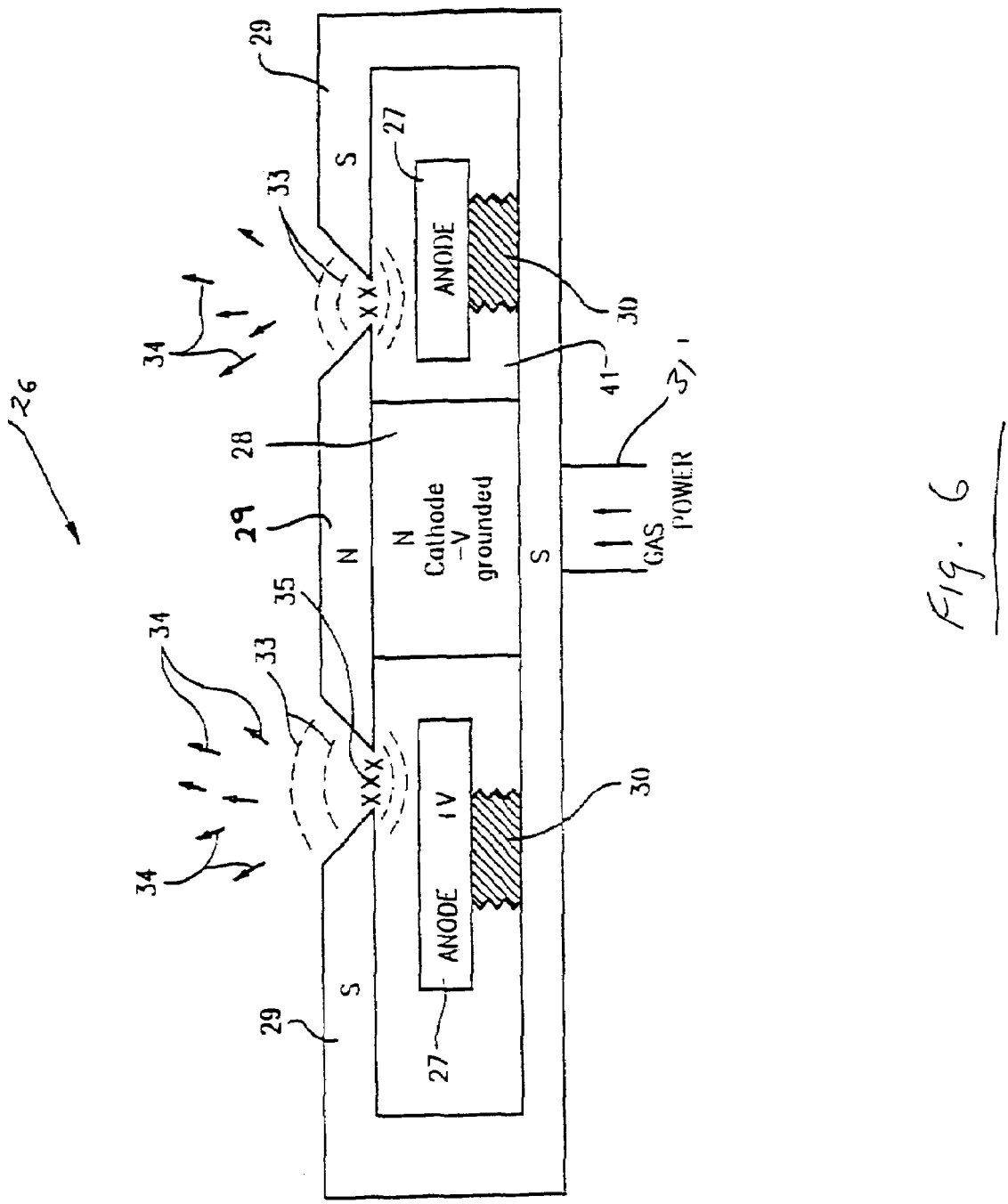
FIG. 6 is a cross sectional view of an example ion source that may be used to ion beam treat layers according to example embodiments of this invention.
Figure 7:
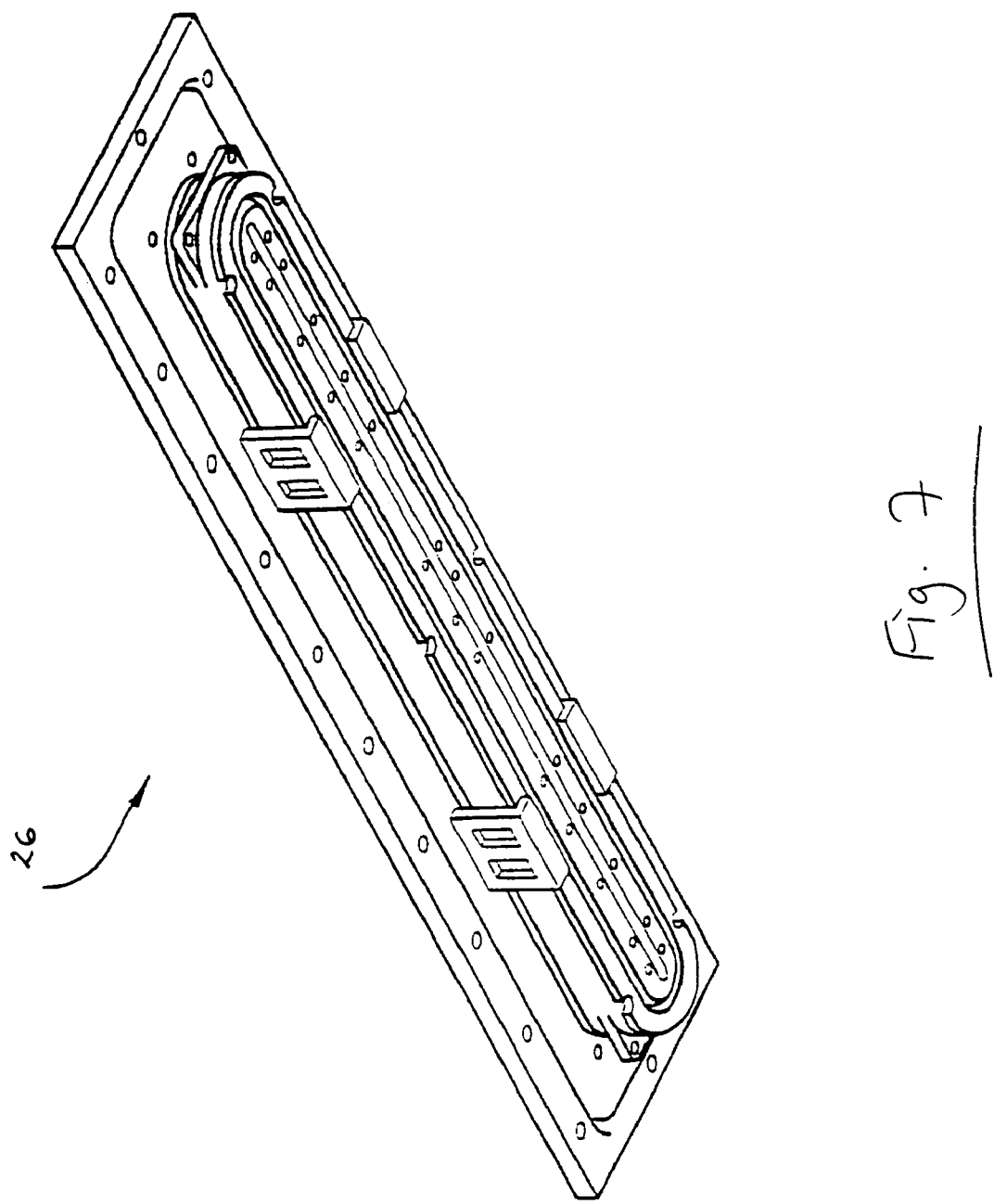
FIG. 7 is a perspective view of the ion source of FIG. 6.

FIGS. 6-7 illustrate an exemplary linear or direct ion beam source 26 which may be used to ion beam treat the surface of sputter deposited layer(s) 25 with at least nitrogen ions in certain example embodiments. Ion beam source (or ion source) 26 includes gas/power inlet 31, racetrack-shaped anode 27, grounded cathode magnet portion 28, magnet poles, and insulators 30. An electric gap is defined between the anode 27 and the cathode 29. A 3 kV or any other suitable DC power supply may be used for source 26 in some embodiments. The gas(es) discussed herein for use in the ion source during the ion beam treatment may be introduced into the source via gas inlet 31, or via any other suitable location. Ion beam source 26 is based upon a known gridless ion source design. The linear source may include a linear shell (which is the cathode and grounded) inside of which lies a concentric anode (which is at a positive potential). This geometry of cathode-anode and magnetic field 33 may give rise to a close drift condition. Feedstock gases (e.g., nitrogen, argon, oxygen, a mixture of nitrogen and argon, etc.) may be fed through the cavity 41 between the anode 27 and cathode 29. The electrical energy between the anode and cathode cracks the gas to produce a plasma within the source. The ions 34 (e.g., nitrogen ions) are expelled out and directed toward the layer to be ion beam treated in the form of an ion beam. The ion beam may be diffused, collimated, or focused. Example ions 34 in beam (B) are shown in FIG. 6.

A linear source as long as 0.5 to 4 meters may be made and used in certain example instances, although sources of different lengths are anticipated in different embodiments of this invention. Electron layer 35 is shown in FIG. 6 and completes the circuit thereby permitting the ion beam source to function properly. Example but non-limiting ion beam sources that may be used to treat layers herein are disclosed in U.S. Pat. Nos. 6,303,226, 6,359,388, and/or 2004/0067363, all of which are hereby incorporated herein by reference.

In certain example embodiments of this invention, coated articles herein may have the following optical and solar characteristics when measured monolithically (before any optional HT). The sheet resistances ($R_s$) herein take into account all IR reflecting layers (e.g., silver layers 9, 19).

Optical/Solar Characteristics (Monolithic; Pre-HT)

| Characteristic | General | More Preferred | Most Preferred |
|---|---|---|---|
| $R_s$ (ohms/sq.): | <=6.0 | <=3.0 | <=2.8 |
| $E_n$: | <=0.09 | <=0.04 | <=0.03 |
| $T_{vis}$ (Ill. C 2°): | >=70% | >=75% | >=75.5% |

In certain example embodiments, coated articles herein may have the following characteristics, measured monolithically for example, after heat treatment (HT):

Optical/Solar Characteristics (Monolithic; Post-HT)

| Characteristic | General | More Preferred | Most Preferred |
|---|---|---|---|
| $R_s$ (ohms/sq.): | <=5.5 | <=2.5 | <=2.1 |
| $E_n$: | <=0.08 | <=0.04 | <=0.03 |
| $T_{vis}$ (Ill. C 2°): | >=70% | >=75% | >=80% |
| Haze: | <=0.40 | <=0.35 | <=0.30 |

Moreover, in certain example laminated embodiments of this invention, coated articles herein which have been heat treated to an extent sufficient for tempering and/or heat bending, and which have been laminated to another glass substrate, may have the following optical/solar characteristics:

Optical/Solar Characteristics (Laminated; Post-HT)

| Characteristic | General | More Preferred | Most Preferred |
|---|---|---|---|
| $R_s$ (ohms/sq.): | <=5.5 | <=2.5 | <=2.1 |
| $E_n$: | <=0.08 | <=0.04 | <=0.03 |
| $T_{vis}$ (Ill. D65 10°): | >=70% | >=75% | >=77% |
| Haze: | <=0.45 | <=0.40 | <=0.36 |

Moreover, coated articles including coatings according to certain example embodiments of this invention have the following optical characteristics (e.g., when the coating(s) is provided on a clear soda lime silica glass substrate 1 from 1 to 10 mm thick; e.g., 2.1 mm may be used for a glass substrate reference thickness in certain example non-limiting instances) (laminated).

Example Optical Characteristics (Laminated: Post-HT)

| Characteristic | General | More Preferred |
|---|---|---|
| $T_{vis}$ (or TY)(I11. D65 10°): | >=75% | >=77% |
| $a*_t$ (I11. D65 10°): | −6 to +1.0 | −4 to 0.0 |
| $b*_t$ (I11. D65 10°): | −2.0 to +8.0 | 0.0 to 4.0 |
| L* (I11. D65 10°): | 88-95 | 90-95 |
| $R_fY$ (I11. C, 2 deg.): | 1 to 12% | 1 to 10% |
| $a*_f$ (I11. C, 2°): | −5.0 to +2.0 | −3.5 to +0.5 |
| $b*_f$ (I11. C, 2°): | −14.0 to +10.0 | −10.0 to 0 |
| L* (I11. C 2°): | 30-40 | 33-38 |
| $R_gY$ (I11. C, 2 deg.): | 1 to 12% | 1 to 10% |
| $a*_g$ (I11. C, 2°): | −5.0 to +2.0 | −2 to +2.0 |
| $b*_g$ (I11. C, 2°): | −14.0 to +10.0 | −11.0 to 0 |
| L* (I11. C 2°): | 30-40 | 33-38 |

The following hypothetical example is provided for purposes of example only, and is not intended to be limiting unless specifically claimed.

EXAMPLE 1

The following hypothetical Example 1 uses a 2.1 mm thick clear glass substrates so as to have approximately the layer stack set forth below and shown in FIG. 3. The layers listed below are formed by sputtering. The thicknesses are approximations, and are in units of angstroms (Å).

Layer Stack for Example 1

| Layer<br>Glass Substrate | Thickness (Å) |
|---|---|
| $Si_xN_y$ | 177 |
| $ZnAlO_x$ | 109 |
| Ag | 96 |
| $NiCrO_x$ | 25 |
| $SnO_2$ | 535 |
| $Si_xN_y$ | 126 |
| $ZnAlO_x$ | 115 |
| Ag | 95 |
| $NiCrO_x$ | 25 |
| $SnO_2$ | 127 |
| $Si_xN_y$ | 237 |

The sputtering processes used in forming the coated article of Example 1 are set forth below. The sputtering gas flows (argon (Ar), oxygen (O), and nitrogen (N)) in the below table are in units of sccm (gas correction factor of about 1.39 may be applicable for argon gas flows herein), and include both tuning gas and gas introduced through the main. The line speed was about 5 m/min. The pressures are in units of mbar× $10^{-3}$. The silicon (Si) targets, and thus the silicon nitride layers, were doped with aluminum (Al). The Zn targets in a similar manner were doped with about 2% Al.

Sputtering Process Used in Example 1

| Cathode | Target | Power (kW) | Ar | O | N | Volts | Pressure |
|---|---|---|---|---|---|---|---|
| C11 | Si | 51.3 | 350 | 0 | 337 | 269 | 2.39 |
| C12 | Si | 51.6 | 350 | 0 | 337 | 271 | 2.36 |
| C14 | Zn | 19.5 | 250 | 350 | 0 | 276 | 2.24 |
| C15 | Zn | 27.8 | 250 | 350 | 0 | 220 | 1.88 |
| C24 | Ag | 9.2 | 250 | 0 | 0 | 541 | 1.69 |
| C25 | NiCr | 16.5 | 350 | 0 | 0 | 510 | 2.33 |
| C28 | Sn | 27.3 | 250 | 454 | 350 | 258 | 2.30 |
| C29 | Sn | 27.3 | 250 | 504 | 350 | 246 | 1.97 |
| C39 | Sn | 30 | 250 | 548 | 350 | 257 | 2.29 |
| C40 | Sn | 28.5 | 250 | 458 | 350 | 245 | 2.20 |
| C41 | Sn | 30.8 | 250 | 518 | 350 | 267 | 2.45 |
| C43 | Si | 59.7 | 350 | 0 | 376 | 285 | 2.47 |
| C45 | Zn | 26.9 | 250 | 345 | 0 | 209 | 3.78 |
| C46 | Zn | 26.8 | 250 | 345 | 0 | 206 | 1.81 |
| C49 | Ag | 9.8 | 150 | 0 | 0 | 465 | 1.81 |
| C50 | NiCr | 16.6 | 250 | 75 | 0 | 575 | 1.81 |
| C54 | Sn | 47.3 | 250 | 673 | 350 | 314 | 1.92 |
| C59 | Si | 65 | 350 | 0 | 463 | 288 | 2.63 |
| C60 | Si | 65 | 350 | 0 | 463 | 330 | 2.56 |

Perform ion beam treatment of overcoat silicon nitride layer using nitrogen ions It can be seen that all layers were initially formed via sputtering. Then, following sputter-deposition of the layers, the overcoat silicon nitride layer (which was doped with aluminum) was ion beam treated via peening with nitrogen ions using an average ion energy of about 750 eV per $N_2^+$ ion. Only nitrogen gas was intentionally introduced into the ion source for the ion beam treatment step. Alternatively, the overcoat silicon nitride layer could have been deposited via IBAD so as to realize compressive stress as illustrated in FIGS. 2(*b*) and 8.

After being sputter deposited onto the glass substrates, and the overcoat silicon nitride layer being ion beam treated, the Example coated article was heat treated in a manner sufficient for tempering and heat bending, and following this heat treatment had the following characteristics as measured in monolithic form.

Characteristics of Example 1 (Monolithic; Post—HT)

| Characteristic | Example 1 |
|---|---|
| Visible Trans. ($T_{vis}$ or TY)(I11. C 2 deg.): | 80.0% |
| a* | −4.8 |
| b* | 10.7 |
| Glass Side Reflectance (RY)(I11 C, 2 deg.): | 8.3% |
| a* | −3.5 |
| b* | 7.8 |
| Film Side Reflective (FY)(I11. C, 2 deg.): | 7.5% |
| a* | −5.8 |
| b* | 14.2 |
| $R_s$ (ohms/square) (pre-HT): | 2.74 |
| $R_s$ (ohms/square) (post-HT): | 2.07 |
| Haze: | 0.28 |

The coated article of the Example was then laminated to another corresponding heat treated and bent glass substrate to form a laminated vehicle windshield product. Following the lamination, the resulting coated article laminate (or windshield) had the following characteristics.

Characteristics of Example 1 (Laminated; Post—HT)

| Characteristic | Example 1 |
| --- | --- |
| Visible Trans. ($T_{vis}$ or TY)(Ill. D65 10°): | 77.8% |
| a* | −3.1 |
| b* | 3.5 |
| Glass Side Reflectance (RY)(Ill C, 2 deg.): | 9.0% |
| a* | 1.5 |
| b* | −9.1 |
| Film Side Reflective (FY)(Ill. C, 2 deg.): | 8.9% |
| a* | −1.1 |
| b* | −7.8 |
| $R_s$ (ohms/square): | see above |
| Haze: | 0.32 |

EXAMPLES 2-4

Examples 2-4 utilized IBAD type of ion beam treatment, and were made and tested as follows. A silicon nitride layer was deposited on a quartz wafer (used for ease of stress testing) using IBAD (e.g., see FIG. 8) under the following conditions in the deposition chamber: pressure of 2.3 mTorr; anode/cathode ion beam source voltage of about 800 V; Ar gas flow in the ion source of 15 sccm; $N_2$ gas flow in the ion source of 15 sccm; sputtering target of Si doped with about 1% boron; 460 V applied to sputtering cathode; 5.4 sputtering amps used; 60 sccm Ar and 40 sccm $N_2$ gas flow used for sputtering gas flow; linear line speed of 50 inches/minute; where the quartz wafer substrate was circular in shape and about 0.1 to 0.15 mm thick. The ion beam treatment time for a given area was about 3 seconds.

Example 3 was the same as Example 2, except that the anode/cathode voltage in the ion source was increased to 1,500 V.

Example 4 was the same as Example 2, except that the anode/cathode voltage in the ion source was increased to 3,000 V.

The stress results of Examples 2-4 were as follows, and all realized desirable compressive stress:

| Example | Compressive Stress | Ion Source Anode/Cathode Volts |
| --- | --- | --- |
| 2 | 750 MPa | 800 V |
| 3 | 1.9 GPa | 1,500 V |
| 4 | 1 GPa | 3,000 V |

It can be seen from Examples 2-4 that the compressive stress of the silicon nitride layer realized due to IBAD deposition is a function of ion energy (i.e., which is a function of voltage applied across the anode/cathode of the ion source 26). In particular, 1,500 anode-cathode volts caused the highest compressive stress to be realized, whereas when higher voltage was applied the stress value began moving back toward tensile.

EXAMPLE 5

Example 5 used a post-sputtering peening type of ion beam treatment, as was made and tested as follows. A silicon nitride layer about 425 Å thick was deposited by conventional magnetron-type sputtering using a Si target doped with Al on a substrate. After being sputter-deposited, the silicon nitride layer had a tensile stress of 400 MPa as tested on the quartz wafer. After being sputter-deposited and stress tested, the silicon nitride layer was ion beam treated using an ion source 26 as shown in FIGS. 6-7 under the following conditions: ion energy of 750 eV per N ion; treatment time of about 18 seconds (3 passes at 6 seconds per pass); and $N_2$ gas used in the ion source. After being ion beam treated, the silicon nitride layer was again tested for stress, and had a tensile stress of only 50 MPa. Thus, the post-sputtering ion beam treatment caused the tensile stress of the silicon nitride layer to drop from 400 MPa down to 50 MPa (a drop of 87.5%). In certain example embodiments of this invention, ion beam treatment may be used to cause tensile stress of a layer (e.g., silicon nitride inclusive layer) to drop by at least 10%, more preferably by at least 20%, even more preferably by at least 50%, and most preferably by at least 75%. This is advantageous for durability purposes.

While the aforesaid Examples ion beam treat layers comprising silicon nitride, this invention is not so limited. Other layers may be ion beam treated for oxidation grading or otherwise ion beam treated in a similar manner. Moreover, other silicon nitride layers in the stack may also be ion beam treated in a like manner.

Figure 5:
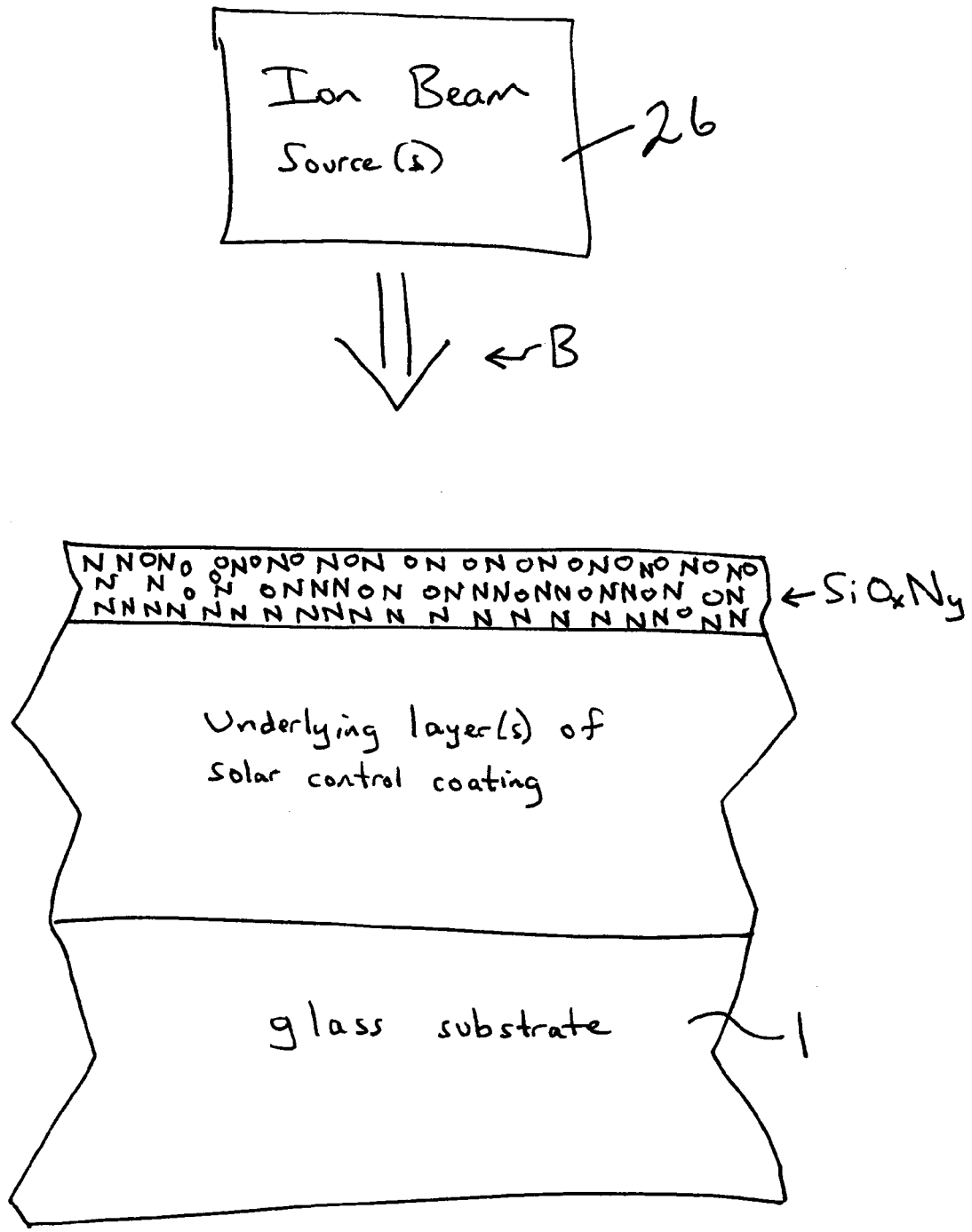
FIG. 5 is a cross sectional view of a coated article according to another example embodiment of this invention, where a silicon nitride overcoat is being ion beam treated with at least oxygen ions to form a layer comprising silicon oxynitride.

Additionally, while the aforesaid embodiments use at least nitrogen ions to ion beam treat layers of or including silicon nitride, this invention is not so limited. In this regard, for example, FIG. 5 illustrates another example embodiment of this invention. The FIG. 5 embodiment is the same as the embodiment(s) described above with respect to FIG. 2(a) (i.e., peening embodiment), except that oxygen ions are used to ion beam treat the overcoat or other silicon nitride layer. In this embodiment, the ion beam treating of the silicon nitride overcoat layer transforms the overcoat layer into a silicon oxynitride layer. This may be advantageous in certain example instances, because this could result in a coated article having higher visible transmission and/or less reflectance. In FIG. 5, the "o" elements in the silicon oxynitride layer represent oxygen, whereas the "N" elements in the layer represent nitrogen. In FIG. 5, the silicon oxynitride layer is oxidation graded due to the ion beam treatment so that the layer is less oxided at a location closer to the underlying layer(s) than at a position further from the underlying layer(s). In other words, in oxidation graded embodiments, there is more oxygen in the layer provided closer to the exterior surface of the coated article than at a location at an inwardly located portion of the silicon oxynitride layer; this is because the ion energy used in the ion beam treatment causes many of the oxygen ions to penetrate the layer but not go all the way therethrough with many of the oxygen ions ending up near the outer portion of half of the layer. In certain example embodiments, only oxygen gas is fed through the ion source in this embodiment, whereas it is also possible to use other gases in addition to oxygen in certain alternative embodiments.

Thus, in the FIG. 5 embodiment where the silicon oxynitride layer is oxidation graded, the ion energy is preferably chosen so that the oxygen ions do not all penetrate the entire thickness of the layer being treated. In other words, an ion energy is chosen so that a portion of the layer is more oxidized further from the glass substrate than is a portion of the layer closer to the glass substrate. In still further embodiments of this invention, a combination of both oxygen and nitrogen gas may be used in IBAD embodiments discussed above for ion beam treatment of certain layers such as layers sputtered from Si inclusive targets (this could also be used to form a silicon oxynitride layer).

In certain other embodiments of this invention, any of the aforesaid embodiments may be applied to other coatings. For example and without limitation, any of the aforesaid embodiments may also be applied to coated articles and thus solar control coatings of one of more of U.S. Patent Document Nos. 2003/0150711, 2003/0194570, U.S. Pat. Nos. 6,723,211, 6,576,349, 5,514,476, 5,425,861, all of which are hereby incorporated herein by reference. In other words, the overcoat layers of any of 2003/0150711, 2003/0194570, U.S. Pat. Nos. 6,723,211, 6,576,349, 5,514,476, and/or 5,425,861, or any other suitable coating, may be ion beam treated according to any of the aforesaid embodiments of this invention.

While many of the above-listed embodiments are used in the context of coated articles with solar control coatings, this invention is not so limited. For example, ion beam treating of layers as discussed herein may also be used in the context of other types of product and coatings relating thereto.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A method of making a coated article, the method comprising:
   providing a glass substrate;
   forming a layer comprising silver on the glass substrate;
   forming a layer comprising silicon nitride on the substrate over the layer comprising silver, wherein the layer comprising silicon nitride is formed on the substrate by at least sputtering a target comprising silicon; and
   after said sputtering, ion beam treating the layer comprising silicon nitride in a manner so as to cause the layer comprising silicon nitride to be nitrogen graded so that a portion of the layer comprising silicon nitride further from the glass substrate has a higher nitrogen content than does a portion of the layer closer to the glass substrate, and wherein said ion beam treating of the layer comprising silicon nitride is performed in a manner so as to cause a stress of the layer comprising silicon nitride to change from tensile stress to compressive stress due to the ion beam treating, and wherein the ion beam treating is performed using nitrogen gas and an ion energy from about 600-1100 eV per $N_2^+$ ion.

2. The method of claim 1, further comprising sputtering at least one dielectric layer on the substrate so as to be located between the substrate and the layer comprising silver, wherein the at least one dielectric layer comprises at least one of silicon nitride and a metal oxide, and wherein the layer comprising silicon nitride which is subjected to the ion beam treating is an outermost layer of a coating supported by the glass substrate.

3. The method of claim 1, further comprising forming at least a layer comprising NiCr on the substrate over at least the layer comprising silver so as to be located between the layer comprising silver and the layer comprising silicon nitride.

4. The method of claim 1, wherein said ion beam treating includes ion beam treating at least part of the layer comprising silicon nitride with at least nitrogen ions, and wherein an outermost 20 Å thick portion of the layer comprising silicon nitride has at least a 5% higher nitrogen content than an innermost 20 Å thick portion of the layer comprising silicon nitride.

5. The method of claim 1, wherein said ion beam treating further causes the silicon nitride to comprise nitrogen-doped $Si_3N_4$.

6. The method of claim 1, wherein the layer comprising silicon nitride following said ion beam treating has compressive stress of from 50 MPa to 2 GPa.

7. The method of claim 1, further comprising heat treating the coated article in a manner sufficient for at least one of tempering and heat bending, so that following said heat treating the coated article has a visible transmission of at least 70% and a sheet resistance ($R_s$) of no greater than 5.5 ohms/square.

8. The method of claim 1, further comprising heat treating the coated article in a manner sufficient for at least one of tempering and heat bending, so that following said heat treating the coated article has a visible transmission of at least 75% and a sheet resistance ($R_s$) of no greater than 2.5 ohms/square.

9. The method of claim 1, wherein prior to any optional heat treating, the coated article in monolithic form has a visible transmission of at least 70% and a sheet resistance ($R_s$) of no greater than 6.0 ohms/square.

10. The method of claim 1, further comprising forming a layer comprising zinc oxide on the glass substrate, so that the layer comprising silver is located over and directly contacting the layer comprising zinc oxide.

11. The method of claim 1, further comprising forming the following layers on the glass substrate in the following order:
   a) forming a layer comprising silicon nitride on the glass substrate;
   b) forming a layer comprising zinc oxide on the glass substrate over at least the layer comprising silicon nitride formed in step a);
   c) forming said layer comprising silver so as to contact an upper surface of the layer comprising zinc oxide;
   d) forming a layer comprising tin oxide on the substrate and over at least the layer comprising silver;
   e) forming another layer comprising zinc oxide on the substrate and over at least the layer comprising tin oxide;
   f) forming another layer comprising silver on the substrate so as to contact an upper surface of the another layer comprising zinc oxide form in step e);
   g) forming said layer comprising silicon nitride that is ion beam treated on the substrate over at least the another layer comprising silver.

12. The method of claim 1, wherein the layer comprising silicon nitride further comprises from about 1-10% aluminum, and wherein said ion beam treating comprises ion beam treating the layer comprising silicon nitride after the layer comprising silicon nitride has been formed by only sputtering.

13. A method of making a coated article which includes a coating supported by a glass substrate, the method comprising:
   providing the glass substrate;
   forming an IR reflecting layer on the glass substrate;
   forming at least an outermost layer of the coating on the substrate over the IR reflecting layer by using at least a sputtering target;
   after forming the outermost layer via sputtering, ion beam treating the outermost layer of the coating in a manner so as to cause a stress of the outermost layer of the coating to change from tensile stress to compressive stress due to the ion beam treating, and wherein the ion beam treating that causes stress of the outermost layer to change from tensile to compressive is performed using nitrogen gas and an ion energy of from about 600-1100 eV per $N_2^+$ ion.

14. The method of claim 13, wherein the outermost layer of the coating comprises silicon nitride.

15. The method of claim 14, wherein the ion beam treating uses at least nitrogen ions which are at least one of: (a) directed toward the layer comprising silicon nitride at the same time the layer comprising silicon nitride is being grown by at least sputtering, and (b) directed toward the layer comprising silicon nitride after the layer comprising silicon nitride has been sputter-deposited.

16. A method of making a coated article which includes a coating supported by a glass substrate, the method comprising:

providing the coating so as to include at least one infrared (IR) reflecting layer sandwiched between at least first and second dielectric layers; and in providing the coating, sputter-depositing at least one layer thereof and after said sputter-depositing then ion beam treating said layer in a manner so as to cause a tensile stress of said layer to be reduced by at least 10% due to the ion beam treating, and wherein the ion beam treating is performed using nitrogen gas and an ion energy from about 600-1100 eV per $N_2^+$ ion.

17. The method of claim 16, wherein the layer which is ion beam treated comprises silicon nitride.

18. The method of claim 16, wherein the ion beam treating causes a tensile stress of the at least one layer to be reduced by at least 20% due to the ion beam treating.

19. The method of claim 16, wherein the ion beam treating causes a tensile stress of the at least one layer to be reduced by at least 50% due to the ion beam treating.

* * * * *